United States Patent
Coolbaugh et al.

(10) Patent No.: US 8,872,281 B2
(45) Date of Patent: Oct. 28, 2014

(54) SILICIDED TRENCH CONTACT TO BURIED CONDUCTIVE LAYER

(75) Inventors: Douglas D. Coolbaugh, Highland, NY (US); Jeffrey B. Johnson, Essex Junction, VT (US); Peter J. Lindgren, Essex Junction, VT (US); Xuefeng Lie, South Burlington, VT (US); James S. Nakos, Essex Junction, VT (US); Bradley A. Omer, Fairfax, VT (US); Robert M. Rassel, Colchester, VT (US); David C. Sheridan, Starkville, MS (US)

(73) Assignee: International Business Machines Corporation, Armonk, NY (US)

(*) Notice: Subject to any disclaimer, the term of this patent is extended or adjusted under 35 U.S.C. 154(b) by 98 days.

(21) Appl. No.: 13/570,737

(22) Filed: Aug. 9, 2012

(65) Prior Publication Data

US 2014/0239498 A1  Aug. 28, 2014

Related U.S. Application Data

(62) Division of application No. 12/269,069, filed on Nov. 12, 2008, now Pat. No. 8,338,265.

(51) Int. Cl.
*H01L 29/78* (2006.01)
*H01L 21/74* (2006.01)
*H01L 21/762* (2006.01)

(52) U.S. Cl.
CPC ........ *H01L 21/743* (2013.01); *H01L 21/76224* (2013.01)
USPC .... 257/401; 257/331; 257/754; 257/E21.427; 438/430; 438/434

(58) Field of Classification Search
CPC ....... H01L 21/74; H01L 21/743; H01L 21/76; H01L 21/76224; H01L 21/823878
USPC .......... 257/331, 401, 754, E21.427; 438/430, 438/434

See application file for complete search history.

(56) References Cited

U.S. PATENT DOCUMENTS 3,443,176 A    5/1969 Agusta et al.
4,549,927 A    10/1985 Goth et al.

(Continued)

FOREIGN PATENT DOCUMENTS

CN    1286803 A    3/2001
CN    1425947 A    6/2003

(Continued)

OTHER PUBLICATIONS

Letter from IBM China which indicates that the date of the issued Office Action is Mar. 5, 2013 in Chinese Patent Application No. 200980144969.3.

*Primary Examiner* — John C Ingham
(74) *Attorney, Agent, or Firm* — Scully, Scott, Murphy & Presser, P.C.; David Cain, Esq.

(57) ABSTRACT

A trench contact silicide is formed on an inner wall of a contact trench that reaches to a buried conductive layer in a semiconductor substrate to reduce parasitic resistance of a reachthrough structure. The trench contact silicide is formed at the bottom, on the sidewalls of the trench, and on a portion of the top surface of the semiconductor substrate. The trench is subsequently filled with a middle-of-line (MOL) dielectric. A contact via may be formed on the trench contact silicide. The trench contact silicide may be formed through a single silicidation reaction with a metal layer or through multiple silicidation reactions with multiple metal layers.

20 Claims, 10 Drawing Sheets

(56) References Cited

U.S. PATENT DOCUMENTS

| | | | |
|---|---|---|---|
| 4,589,193 A | * | 5/1986 | Goth et al. .............. 438/430 |
| 4,589,196 A | | 5/1986 | Anderson |
| 4,668,338 A | | 5/1987 | Maydan et al. |
| 4,670,970 A | | 6/1987 | Bajor |
| 4,682,405 A | | 7/1987 | Blanchard et al. |
| 4,745,083 A | | 5/1988 | Huie |
| 4,751,198 A | | 6/1988 | Anderson |
| 4,839,309 A | | 6/1989 | Easter et al. |
| 5,151,378 A | | 9/1992 | Ramde |
| 5,155,563 A | | 10/1992 | Davies et al. |
| 5,548,150 A | | 8/1996 | Omura et al. |
| 5,554,870 A | | 9/1996 | Fitch et al. |
| 5,821,144 A | | 10/1998 | D'Anna et al. |
| 5,841,166 A | | 11/1998 | D'Anna et al. |
| 5,900,663 A | | 5/1999 | Johnson et al. |
| 5,913,124 A | * | 6/1999 | Lin et al. .............. 438/302 |
| 5,920,108 A | | 7/1999 | Hemmenway et al. |
| 5,949,104 A | | 9/1999 | D'Anna et al. |
| 6,034,415 A | | 3/2000 | Johnson et al. |
| 6,048,772 A | | 4/2000 | D'Anna |
| 6,054,385 A | | 4/2000 | Gardner et al. |
| 6,063,678 A | | 5/2000 | D'Anna |
| 6,190,978 B1 | | 2/2001 | D'Anna |
| 6,222,233 B1 | | 4/2001 | D'Anna |
| 6,271,552 B1 | | 8/2001 | D'Anna |
| 6,326,292 B1 | | 12/2001 | Soderbarg et al. |
| 6,333,235 B1 | | 12/2001 | Lee et al. |
| 6,506,642 B1 | | 1/2003 | Luning et al. |
| 6,507,078 B1 | | 1/2003 | Yu |
| 6,521,923 B1 | | 2/2003 | D'Anna et al. |
| 6,686,627 B2 | | 2/2004 | D'Anna et al. |
| 6,724,066 B2 | | 4/2004 | Swanson et al. |
| 6,762,456 B1 | | 7/2004 | D'Anna et al. |
| 6,770,951 B2 | | 8/2004 | Huang et al. |
| 6,770,952 B2 | | 8/2004 | Babcock et al. |
| 6,787,428 B2 | | 9/2004 | Lee et al. |
| 6,806,157 B2 | | 10/2004 | Yang et al. |
| 6,806,159 B2 | | 10/2004 | Pinto et al. |
| 6,831,332 B2 | | 12/2004 | D'Anna et al. |
| 6,838,348 B2 | | 1/2005 | Babcock et al. |
| 6,838,731 B1 | | 1/2005 | D'Anna et al. |
| 6,847,086 B2 | | 1/2005 | Kim |
| 6,917,083 B1 | | 7/2005 | Violette et al. |
| 7,061,057 B2 | | 6/2006 | Babcock et al. |
| 7,468,307 B2 | | 12/2008 | Hartner et al. |
| 7,982,281 B2 | * | 7/2011 | Dehlinger .............. 257/508 |
| 2002/0142552 A1 | * | 10/2002 | Wu .............. 438/301 |
| 2002/0158309 A1 | | 10/2002 | Swanson et al. |
| 2002/0160562 A1 | | 10/2002 | Babcock et al. |
| 2003/0040160 A1 | | 2/2003 | Huang et al. |
| 2003/0062589 A1 | | 4/2003 | Babcock et al. |
| 2003/0062598 A1 | | 4/2003 | Pinto et al. |
| 2003/0116785 A1 | | 6/2003 | D'Anna et al. |
| 2003/0218209 A1 | | 11/2003 | D'Anna et al. |
| 2004/0124462 A1 | | 7/2004 | D'Anna et al. |
| 2004/0207046 A1 | | 10/2004 | Babcock et al. |
| 2004/0209433 A1 | | 10/2004 | Babcock et al. |
| 2004/0238871 A1 | | 12/2004 | Herzum et al. |
| 2005/0037588 A1 | | 2/2005 | Pinto et al. |
| 2005/0146036 A1 | | 7/2005 | Huang |
| 2005/0280101 A1 | | 12/2005 | Babcock et al. |
| 2007/0010081 A1 | | 1/2007 | Luo et al. |
| 2007/0018195 A1 | | 1/2007 | Hartner et al. |
| 2008/0239792 A1 | | 10/2008 | Wann |

FOREIGN PATENT DOCUMENTS

| | | |
|---|---|---|
| CN | 1893020 A | 1/2007 |
| KR | 2002041626 | 6/2002 |

\* cited by examiner

SILICIDED TRENCH CONTACT TO BURIED CONDUCTIVE LAYER

CROSS REFERENCE TO RELATED APPLICATION

This application is a divisional of U.S. patent application Ser. No. 12/269,069, filed Nov. 12, 2008 the entire content and disclosure of which is incorporated herein by reference.

STATEMENT REGARDING FEDERALLY SPONSORED RESEARCH OR DEVELOPMENT

This invention was made with Government support under Contract No.: BAA N66001-03-X-6010, N66001-02-C-8011 awarded by Defense Advanced Research Projects Agency (DARPA). The government has certain rights in this invention.

FIELD OF THE INVENTION

The present invention relates to semiconductor structures, and particularly to semiconductor structures with a buried conductive layer and a silicided trench contact thereto and methods of manufacturing the same.

BACKGROUND

A variety of semiconductor devices, for example, bipolar transistors, positive-intrinsic-negative (PIN) diodes, and varactor diodes are formed in a vertical configuration that requires a buried terminal located within a semiconductor substrate and at a depth from the surface of the semiconductor substrate. Contacts to such buried terminals are formed via a buried conductive layer, such as a heavily doped buried semiconductor layer, located within the semiconductor substrate and a reachthrough that vertically extends from the surface of the semiconductor substrate to the buried conductive layer.

Typically, the reachthrough, or the "sinker implant region" as it is alternatively called, is formed by ion implantation into a semiconductor region located above a portion of the buried conductive layer such that the semiconductor region is heavily doped with dopants. Relatively low conductivity, typically on the order of about $1.0 \times 10^{-3}$ Ω-cm or less, may be achieved by heavy ion implantation with a dopant concentration in the range from about $3.0 \times 10^{19}/cm^3$ to about $5.0 \times 10^{21}/cm^3$, and preferably on the order of $2.0 \times 10^{20}/cm^3$ or higher. The function of the reachthrough is to provide a low resistance current path to the buried conductive layer, and therefore, any resistance of the reachthrough region is parasitic, i.e., unintended adverse circuit parameter.

Referring to FIG. 1, an exemplary prior art structure comprising a bipolar complementary metal-oxide-semiconductor (BiCMOS) structure is shown. The exemplary prior art structure comprises a semiconductor substrate 8, within which a semiconductor layer 10, shallow trench isolation 20, a buried conductive layer 28, which is a subcollector in this example, a reachthrough 31, a collector 41 of a bipolar transistor, and source and drain regions 35 of a metal-oxide-semiconductor field effect transistor (MOSFET) are formed. Components of the MOSFET such as a gate dielectric 32, a gate conductor 33, a gate spacer 34, and source and drain silicide 39 are located on top of the semiconductor substrate 8. Components of a bipolar transistor such as an intrinsic base 42, and extrinsic base 43, an emitter pedestal 44, an emitter 45, a reachthrough silicide 47, a base silicide 48, and an emitter silicide 49 are also located on top of the semiconductor substrate 8.

The reachthrough 31 in the exemplary prior art structure comprises a heavily doped semiconductor material. The reachthrough silicide 47 is formed on a top surface of the reachthrough 31, and consequently, does not directly contact the buried conductor layer 28. In this exemplary prior art structure, the reachthrough silicide 47, the reachthrough 31, and the buried conductive layer 28 form a current path for the bipolar transistor. Any resistance of the reachthrough 31 thus contributes to the parasitic resistance of the bipolar transistor structure. While providing a relative low resistivity, the resistivity of the doped semiconductor material in the reachthrough is still higher than that of a silicide material. The same problem applies to any semiconductor structure with a buried conductive layer and a reachthrough structure formed with a doped semiconductor material.

Thus, the parasitic resistance of the reachthrough oftentimes degrades or limits the performance of a semiconductor device with a buried terminal. For example, the unit current gain frequency ($f_T$), which is the frequency at which the current gain becomes 1, and the maximum oscillation frequency ($f_{MAX}$), which is the maximum frequency at which there is still power gain in a bipolar transistor, may be limited by the resistance of the reachthrough region that contacts a subcollector, which is a buried conductive layer formed by heavy doping of a buried semiconductor region. For another example, the quality factor Q of a varactor, which defines the sharpness of a resonance in a tuning circuit, may be degraded by a parasitic resistance of a reachthrough to a buried conductive layer which may be in contact with or integrated with a buried capacitor electrode.

Further, the depth of a buried conductive layer 28 is typically limited by the ability to form the reachthrough 31 that contacts the buried conductive layer 28. To provide a low resistance current path to the buried conductive layer 28, the reachthrough 31 must contact the buried conductive layer. While a deep buried conductive layer may be formed by implanting a semiconductor region followed by an epitaxy of a semiconductor material of significant thickness, for example, greater than 2 microns, the depth of the reachthrough that can be formed by ion implantation is limited by the projected range of the implanted ions. Thus, the reachthrough 31 does not contact the deep buried conductive layer if the depth of the deep buried conductive layer exceeds the projected ranges of the implanted ions. For example, the projected range of boron ions accelerated at 1.0 MeV and accelerated into silicon is only about 1.8 microns. The projected ranges for phosphorus ions and arsenic ions accelerated at 1.0 MeV and accelerated into silicon are even less, and are only about 1.2 microns and 0.6 microns, respectively. In addition, the buried conductive layers often require a heavy doping concentration on the order of $2.0 \times 10^{20}/cm^3$ or higher to achieve low resistivity. Implantation of dopants at such high energy and at such a high dose requires a long implantation time on a high performance ion implanter, and consequently, high processing costs. Further, even if such processing steps are employed, the depth of a buried conductive layer does not exceed 2.0 microns unless the ion implantation energy is increased even higher, which is difficult to achieve with commercially available ion implanters. In a structure containing a reachthrough 31 that contacts the buried conductive layer 28 as in FIG. 1, the increased depth of the buried conductive layer 28 also increases the vertical dimension of the reachthrough 31, and correspondingly increases the resistance of the reachthrough 31.

Therefore, there exists a need to provide semiconductor structures with a less resistive path from the surface of a semiconductor substrate to a buried conductive layer compared with the prior art reachthrough structures.

Further, there exists a need to provide a semiconductor structure that has a buried conducive layer located at a depth that exceeds the projected ranges of conventional ion implantation process and a low resistance contact to the buried conductive layer.

In addition, there exists a need to provide methods of manufacturing semiconductor structures with such a less resistive path from the surface of the semiconductor substrate to the buried conductive layer and/or with such a buried conducive layer located at a depth that exceeds the projected ranges of conventional ion implantation process with minimum additional processing steps and processing costs.

SUMMARY

The present invention addresses the needs described above by providing a semiconductor structure with a silicided trench contact that contacts a buried conductive layer and methods of manufacturing the same.

Specifically, the present invention forms the silicided trench contact by first forming a contact trench that reaches a buried conductive layer within a semiconductor substrate prior to a silicidation process. A trench contact silicide is formed at the bottom, on the sidewalls of the trench, and on a portion of the top surface of the semiconductor substrate. The trench is subsequently filled with a middle-of-line (MOL) dielectric. A contact via is formed on the trench contact silicide. The trench contact silicide may be formed through a single silicidation reaction with a metal layer or through multiple silicidation reactions with multiple metal layers.

According to a first embodiment of the present invention, a semiconductor structure comprises:

a buried conductive layer in a semiconductor substrate;

a trench contact silicide contacting the buried conductive layer and contacting a top surface of the semiconductor layer; and a middle-of-line (MOL) dielectric located on and within the trench contact silicide.

The semiconductor structure may further comprise a contact via contacting the trench contact silicide and surrounded by the MOL dielectric. The trench contact silicide may have tapered sidewalls. Preferably, the buried conductor layer is located below shallow trench isolation and is disjoined from the shallow trench isolation. The semiconductor structure may, or may not, further comprise a doped semiconductor region directly underneath the trench contact silicide. Further, the doped semiconductor region may, or may not, contact the buried conductive layer. Optionally, but preferably, the doped semiconductor region is topologically homeomorphic to a torus, i.e., the doped semiconductor region may be transformed into a torus by continuous stretching and bending.

According to the present invention, the trench contact silicide preferably contains:

a bottom trench contact silicide contacting the buried conductive layer;

a sidewall trench contact silicide adjoining the bottom trench contact silicide; and a top trench contact silicide located on a top surface of the semiconductor substrate and adjoining the sidewall trench contact silicide.

According to the first embodiment of the present invention, the bottom trench contact silicide, the sidewall trench contact silicide, and the top trench contact silicide have substantially the same composition and are formed during the same processing steps. The bottom trench contact silicide, the sidewall trench contact silicide, and the top trench contact silicide may have substantially the same thickness as well by depositing sufficient amount of metal in a contact trench on which trench contact silicide is subsequently formed so that the silicide formation is not limited by the supply of the metal. Alternatively, the thickness of the bottom trench contact silicide and the thickness of the sidewall trench contact silicide may be less than the thickness of the top trench contact silicide by limiting the amount of metal in the contact trench.

According to a second embodiment of the present invention, the bottom trench contact silicide and the sidewall trench contact silicide may have a first composition and the top trench contact silicide may have a second composition. The first composition and the second composition may be the same or they may be different.

Further, the bottom trench contact silicide and the sidewall trench contact silicide may have a first thickness and the top trench contact silicide may have a second thickness. The first thickness and the second thickness may be different. Preferably, the first thickness is greater than the second thickness.

According to both embodiments of the present invention, the semiconductor structure may further comprise at least one metal silicide region, wherein the at least one metal silicide region is disjoined from the trench contact silicide and has substantially the same composition and the same thickness as the top trench contact silicide.

According to the first embodiment of the present invention, a method of manufacturing a semiconductor structure comprises:

forming a buried conductive layer in a semiconductor substrate;

forming a contact trench that extends from a top surface of the semiconductor substrate onto the buried conductive layer; and forming a trench contact silicide and at least one metal silicide region during the same processing steps, wherein the trench contact silicide contacts the buried conductive layer, extends to the top surface of the semiconductor substrate, and has substantially the same composition as the at least one metal silicide region.

The method according to the first embodiment of the present invention may further comprise:

forming a dielectric layer on the top surface of the semiconductor substrate; and lithographically patterning and etching a portion of the dielectric layer over the buried conductive layer prior to forming a contact trench.

Preferably, the dielectric layer is removed prior to the forming of the trench contact silicide and the at least one metal silicide region.

Optionally, the method according to the first embodiment of the present invention further comprises forming a doped semiconductor region, wherein the doped semiconductor region is located directly beneath the trench contact silicide and contacts the buried conductive layer.

Preferably, the contact trench is filled with a middle-of-line (MOL) dielectric, wherein the MOL dielectric directly contacts the trench contact silicide.

At least one metal-oxide-semiconductor filed effect transistor (MOSFET) with source and drain regions may be formed prior to forming the trench contact silicide.

The depth of the buried conductive layer may be in the range of the depth of conventional buried conductive layers, i.e., in the range of less than 1.8 microns. Alternatively, the depth of the buried conductive layer may exceed 1.8 microns and may be in the range from about 2.0 microns to about 8.0 microns, which exceeds the depth of conventional buried conductive layers.

According to the second embodiment of the present invention, a method of manufacturing a semiconductor structure comprises:

forming a buried conductive layer in a semiconductor substrate;

forming a contact trench that extends from a top surface of the semiconductor substrate onto the buried conductive layer; and performing a first silicidation process to form a bottom trench contact silicide and sidewall trench contact silicide, wherein the bottom trench contact silicide contacts the buried conductive layer and the sidewall trench contact silicide adjoins the bottom trench contact silicide; and performing a second silicidation process to form a top trench contact silicide, wherein the top trench contact silicide is formed on a top surface of the semiconductor substrate.

The method according to the second embodiment of the present invention may further comprise:

forming a dielectric layer on the top surface of the semiconductor substrate; and lithographically patterning and etching a portion of the dielectric layer over the buried conductive layer prior to forming a contact trench.

Preferably, the dielectric layer is removed after the performing of the first silicidation process and prior to the performing of the second silicidation process.

Optionally, the method according to the second embodiment of the present invention further comprises forming a doped semiconductor region, wherein the doped semiconductor region is located directly beneath the trench contact silicide and contacts the buried conductive layer.

Preferably, the contact trench is filled with a middle-of-line (MOL) dielectric, wherein the MOL dielectric directly contacts the trench contact silicide.

At least one metal-oxide-semiconductor filed effect transistor (MOSFET) with source and drain regions may be formed prior to forming the trench contact silicide.

The depth of the buried conductive layer may be in the range of the depth of conventional buried conductive layers, i.e., in the range of less than 1.8 microns. Alternatively, the depth of the buried conductive layer may exceed 1.8 microns and may be in the range from about 2.0 microns to about 8.0 microns, which exceeds the depth of conventional buried conductive layers.

DETAILED DESCRIPTION

Figure 1:
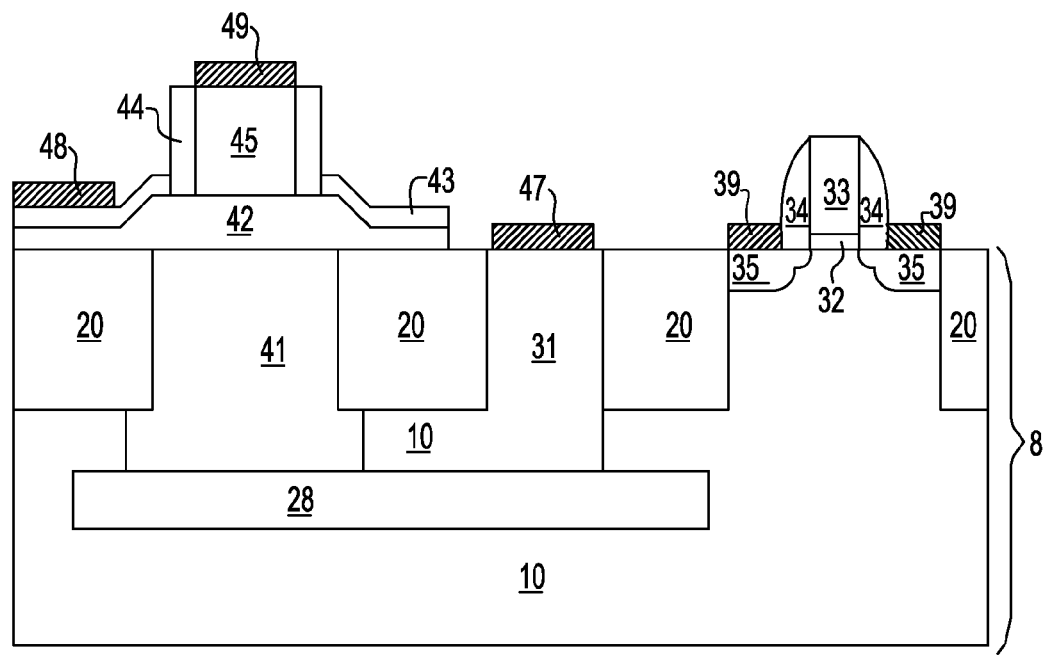
FIG. 1 is a vertical cross-sectional view of a prior art exemplary semiconductor structure.

As stated above, the present invention relates to semiconductor structures with a buried conductive layer and a sili-cided trench contact thereto and methods of manufacturing the same, which are now described in detail with accompanying figures. It is noted that like and corresponding elements are referred to by like reference numerals.

Figure 2:
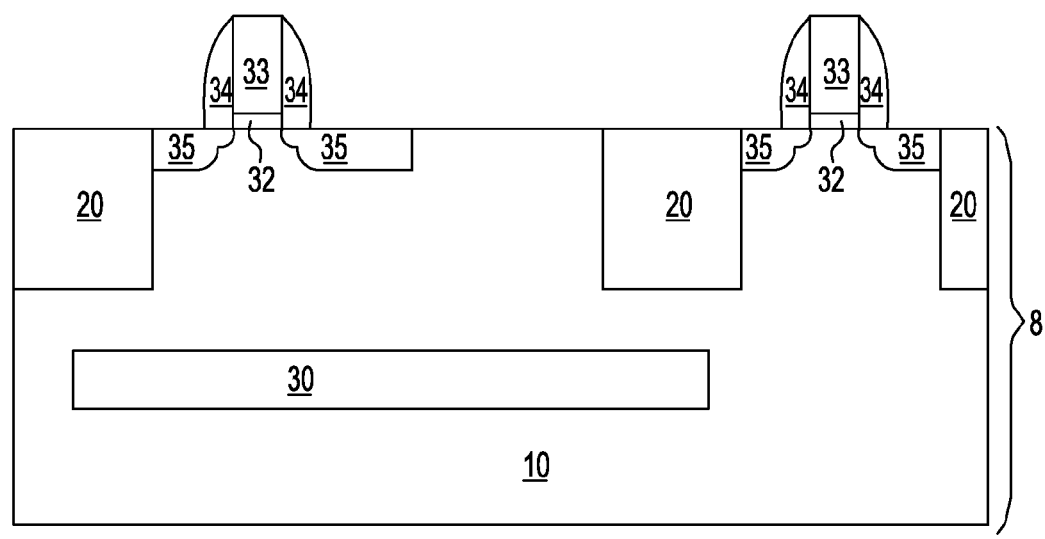
FIGS. 2-7 are sequential vertical cross-sectional views of an exemplary semiconductor structure according to the first and second embodiments of the present invention.

Referring to FIG. 2, an exemplary semiconductor structure according to the present invention comprises two metal-oxide-semiconductor field effect transistors (MOSFETs), shallow trench isolation 20, and a buried conductive layer 30 formed within a semiconductor layer 10. Each of the two MOSFETs comprises a gate dielectric 32, a gate conductor 33, a gate spacer 34, and source and drain regions 35. The semiconductor layer 20, the shallow trench isolation 20, the buried conductive layer 30, and the source and drain regions 35 comprise a semiconductor substrate 8.

The use of the two MOSFET in the description of the present invention does not limit the application of the present invention to the exemplary structures in any way, but serves as a demonstration of the practicability of the present invention. Electrically connecting any other semiconductor devices and/or contact vias formed on a semiconductor substrate to the inventive structure is within the knowledge of one of ordinary skill in the art, and is herein explicitly contemplated.

Non-limiting examples of semiconductor materials comprising the semiconductor layer 10 include silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor layer 10 may be intrinsic, i.e., doped with an insignificant level of dopants at a doping concentration of less than $1.0 \times 10^{16}/cm^3$, or may be lightly or medium doped at a doping concentration typically in the range from about $1.0 \times 10^{16}/cm^3$ to about $1.0 \times 10^{19}/cm^3$. Depending on the type of semiconductor devices, potions of the semiconductor layer 8 may be doped at a doping concentration that exceeds the original doping concentration of the semiconductor layer 10 to form a component of a semiconductor device such as the source and drain regions 35 and the buried conductive layer 30 in FIG. 2.

The buried conductive layer 30 is typically a heavily doped semiconductor region formed by ion implantation into the semiconductor substrate 8. The buried conductor layer may be a subcollector of a bipolar transistor, a bottom electrode of a varactor or a PIN diode, or any buried doped component of a semiconductor device. The buried conductive layer 30 may be p-doped or n-doped. The doping concentration in the buried conductive layer 30 is in the range from about $3.0 \times 10^{19}/cm^3$ to about $5.0 \times 10^{21}/cm^3$, and preferably in the range from about $1.0 \times 10^{20}/cm^3$ to about $5.0 \times 10^{20}/cm^3$. The resistivity of the buried conductive layer 30 is preferably on the order of about $1.0 \times 10^{-3}$ Ω-cm or less.

According to the present invention, the depth of the buried conductive layer 30, which is the vertical distance between the top surface of the buried conductive layer 30 and the top surface of the semiconductor substrate 8, e.g., the interface between the semiconductor layer 10 and the gate dielectric 32, is not limited by the maximum projected range of implanted dopants that are implanted into a reachthrough as in the prior art, but is limited only by the depth of a contact trench that is formed in the semiconductor substrate 8. According to the prior art, the depth of a conventional reach-through is limited to a range not exceeding 1.2 microns for an n-type doped reachthrough and to a range not exceeding 1.8 microns for a p-type doped reachthrough for ion implantation energies not exceeding 1 MeV, which is a limit for commercially available ion implanters. However, the depth of the contact trench in the present invention is not limited by such constraints, but may exceed 2.0 microns and may reach up to 8.0 microns, thereby enabling placement of the buried conductive layer 30 at a depth greater than 2.0 microns. Alternatively, the depth of the buried conductive layer 30 may be at a depth less than 2.0 microns, or at a depth less than 1.8 microns, which is the depth of the conventional buried conductive layers known in the prior art.

The shallow trench isolation 20 is formed in the semiconductor substrate 8 by methods well known in the art. For example, after forming pad dielectric layers on the semiconductor substrate 8, shallow trenches are lithographically patterned on a photoresist and the pattern is transferred into the semiconductor substrate 8 by a reactive ion etch (RIE). The shallow trenches are filled with dielectric material, and optionally, with suitable liners. The fill material is subsequently planarized utilizing the pad dielectric layers as a stopping layer. Some of the pad dielectric layers are subsequently removed.

At least one semiconductor device is formed on the semiconductor substrate. In the exemplary structure in FIG. 2, two MOSFETs are shown. The two MOSFETs in FIG. 2 are shown only for illustrative purposes and do not limit the scope of the present invention. Any bipolar devices and/or complementary metal-oxide-semiconductor (CMOS) devices, such as bipolar transistors, MOSFETs, diodes, electrical fuses, and passive components (resistors, capacitors, inductors, varactors, etc.) may be formed in, or on, the semiconductor substrate 8 according the methods known in the art.

Figure 3:
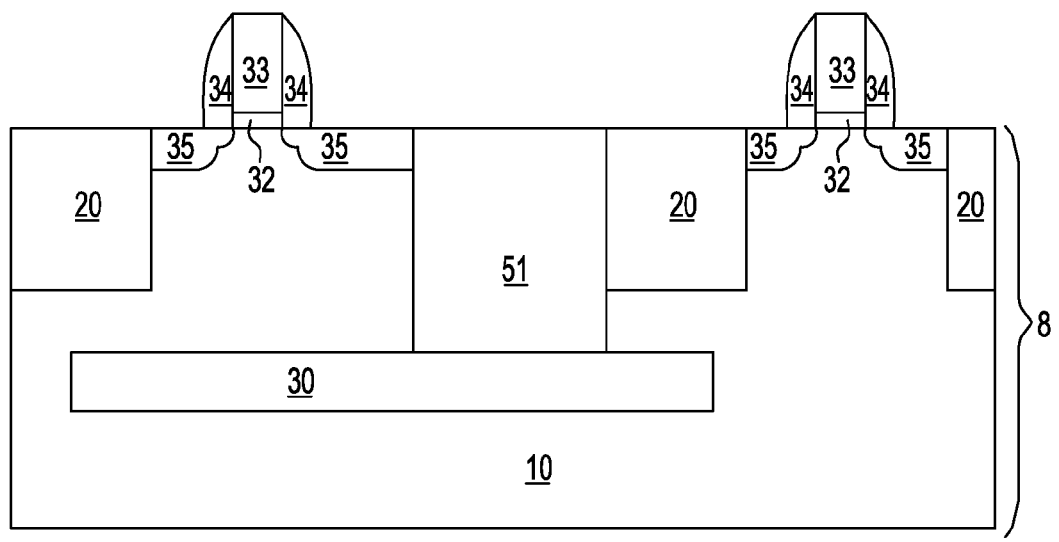
Figure 4:
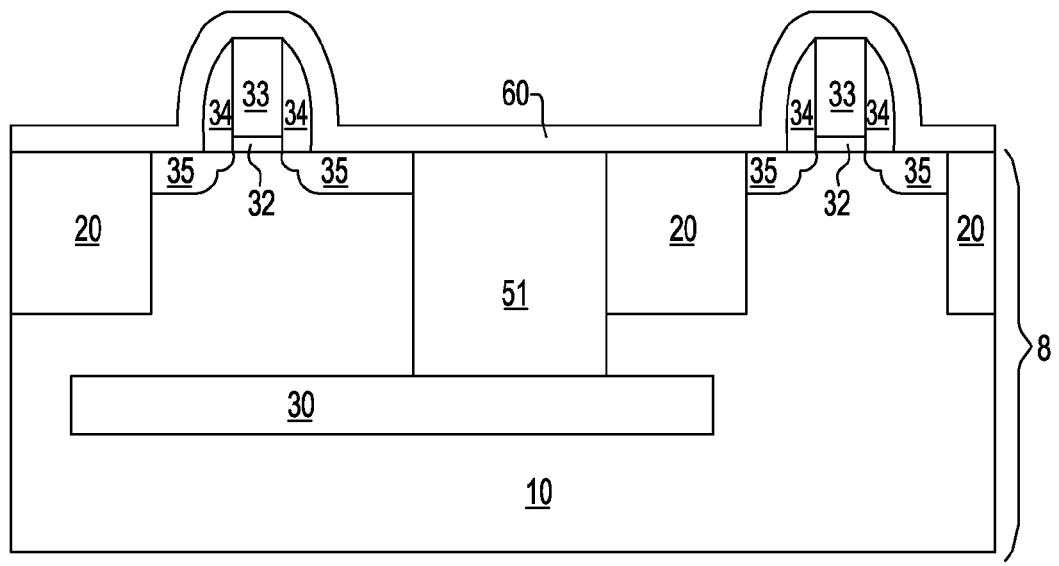

Referring to FIG. 3, an implanted columnar semiconductor region 51 may be formed preferably by ion implantation into an area of the semiconductor substrate 8 that overlies the buried conductive layer 30. Typically, the area of the implanted columnar semiconductor region 51 is smaller than the area of the buried conductive layer 30. Preferably, the implanted columnar semiconductor region 51 is doped with dopants of the same conductivity type as the buried conductive layer 30 at a dopant concentration in the range from about $3.0 \times 10^{19}/cm^3$ to about $5.0 \times 10^{21}/cm^3$, and preferably in the range from about $1.0 \times 10^{20}/cm^3$ to about $5.0 \times 10^{20}/cm^3$. The resistivity of implanted columnar semiconductor region 51 is typically on the order of about $1.0 \times 10^{-3}$ $\Omega$-cm or less.

The implanted columnar semiconductor region 51 may contact the buried conductive layer 30 as shown in FIG. 3, or it may not contact the buried conductive layer 30. Alternately, the implanted columnar semiconductor region 51 may not be employed in practicing the present invention, i.e., the implanted columnar semiconductor region 51 is optional. The implanted columnar semiconductor region 51 may, or may not, contact the buried conductive layer 30. If the depth of the buried conductive layer 30 is within the projected range for implanted ions in conventional ion implantation, it is preferred that the implanted columnar semiconductor region 51 contacts the buried conductive layer 30. The function of the implanted columnar semiconductor region 51 is to subsequently provide a doped semiconductor region that provides a parallel conduction path to a trench contact silicide, which is also to be subsequently formed. The additional current path enabled by the use of the doped semiconductor region is beneficial, but not necessary in the practice of the present invention.

A salicide masking dielectric layer 60 is formed over the semiconductor substrate 8 and other semiconductor devices that may be present on the semiconductor substrate 8 at this point. Salicide refers to self-aligned silicide as it is well known in the art. The salicide masking dielectric layer 60 comprises a dielectric material which prevents formation of silicide between a semiconductor material disposed on one side of the dielectric material and a metal layer disposed on the other side of the dielectric material during a silicidation process. Specifically, the salicide masking dielectric layer 60 may comprise silicon nitride, silicon oxide, silicon oxynitride, high-K dielectric material, or a stack thereof, and preferably comprises silicon nitride. The thickness of the salicide masking dielectric material 60 may be in the range from about 5 nm to about 100 nm, and preferably in the range from about 30 nm to about 70 nm. The salicide masking dielectric lay 60 may, or may not, apply stress to the underlying structures. Multiple salicide masking dielectric layers 60 which may be fully overlaid or partially overlaid amongst one another may also be employed.

Figure 5:
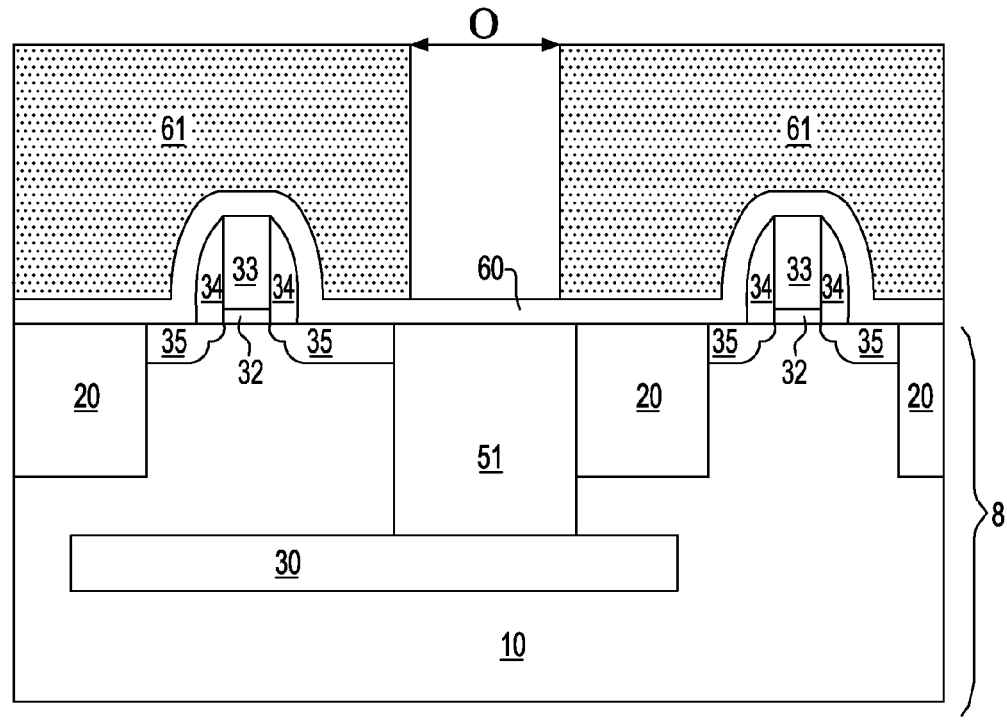

Referring to FIG. 5, a photoresist 61 is applied onto the top surface of the salicide masking dielectric layer 60 and lithographically patterned to define an area for a contact trench. If the implanted columnar semiconductor region 51 is formed in the semiconductor substrate 8, an opening O in the photoresist 61 preferably overlaps at least a portion of the area of the implanted columnar semiconductor region 51. Preferably, the opening O that defines the area of the contact trench in the photoresist 61 is located within the area of the implanted columnar semiconductor region 51 in this case.

Figure 6:
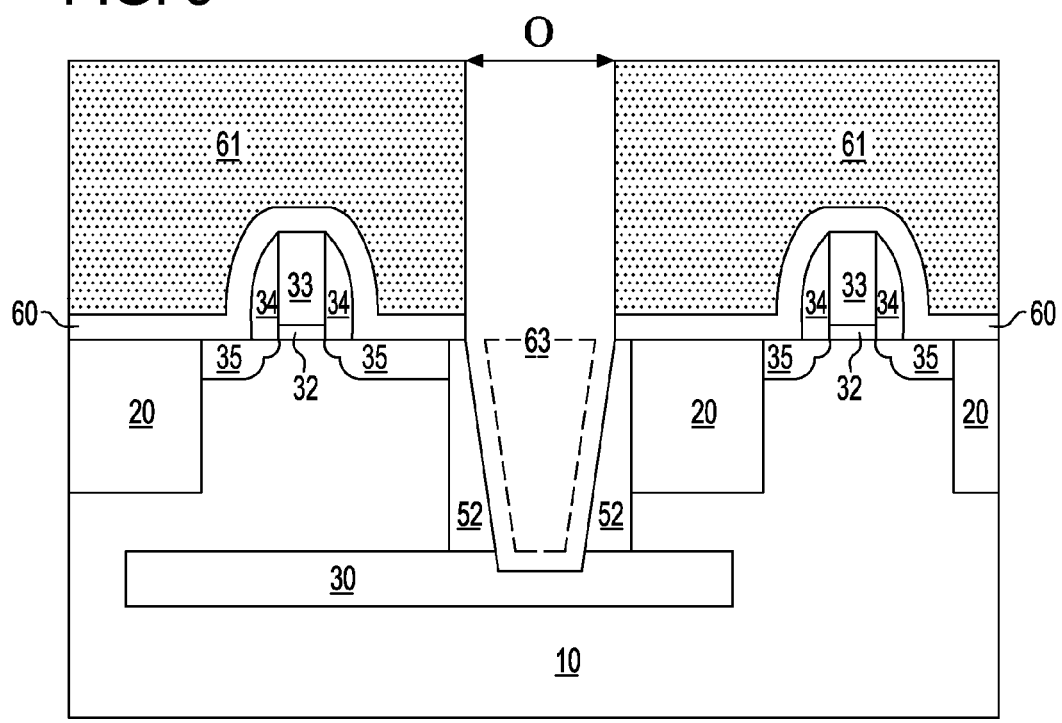

Referring to FIG. 6, a contact trench 63 is formed in the semiconductor substrate 8 directly underneath the opening O in the photoresist 61 by etching the exposed area of the semiconductor substrate 8, for example, by reactive ion etch (RIE). The depth of the contact trench 63 may be the same as, or it may exceed the depth of the buried conductive layer 30. As discussed in one of the paragraphs accompanying FIG. 2, the depth of the contact trench 63 may exceed 2.0 microns and may reach up to 8.0 microns, or alternatively, may be at a depth less than 2.0 microns, or at a depth less than 1.8 microns, which is the depth of conventional buried conductive layers known in the prior art. Correspondingly, the depth of the contact trench 63 may be in the range from about 2.0 microns to about 8.0 microns, or alternatively, may be in the range equal to or less than about 2.0 microns.

The contact trench 63 may have tapered sidewalls that have an angle less than 90° as measured from a horizontal surface. The taper angle may be in the range from about 60° to about 90°, and preferably is in the range from about 73° to about 85°.

If the opening O in the photoresist 61 overlaps at least a portion of the area of the implanted columnar semiconductor region 51, a volume of the implanted columnar semiconductor region 51 directly underneath the opening O is removed. A doped semiconductor region 52 is formed at least on a portion of the sidewalls of the contact trench 63. If the opening O that defines the area of the contact trench 63 in the photoresist 61 is located within the area of the implanted columnar semiconductor region 51, a center portion of the implanted columnar semiconductor region 51 is removed so that the remaining portion of the implanted columnar semiconductor region 51, which forms the doped semiconductor region 52, has a hole in the middle that corresponds to the shape of the contact trench 63. In this case, the doped semiconductor region 52 is topologically homeomorphic to a torus, that is, the doped semiconductor region 52 may be transformed into a torus by continuous stretching and bending.

Figure 7:
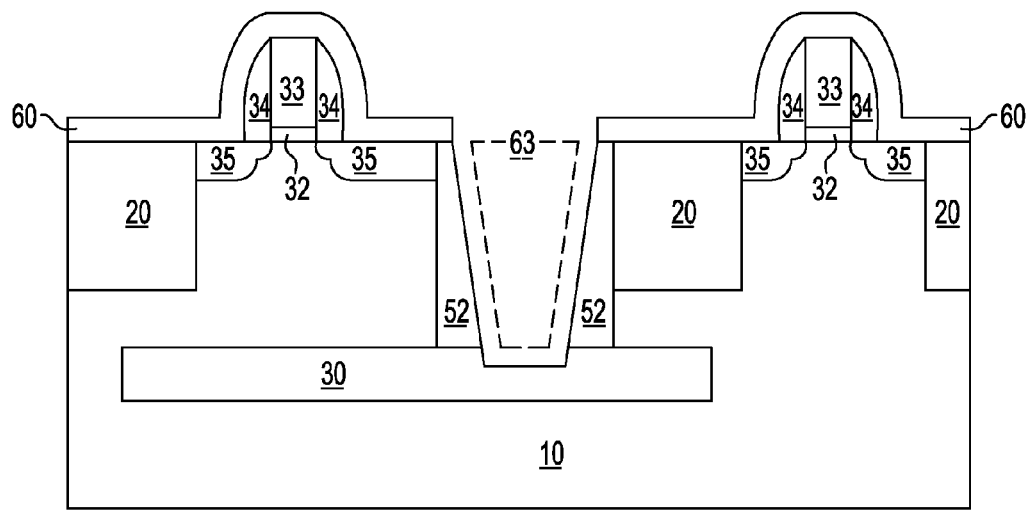

Referring to FIG. 7, the photoresist 61 is removed by conventional methods such as ashing. Suitable surface clean may be performed as necessary.

Figure 8:
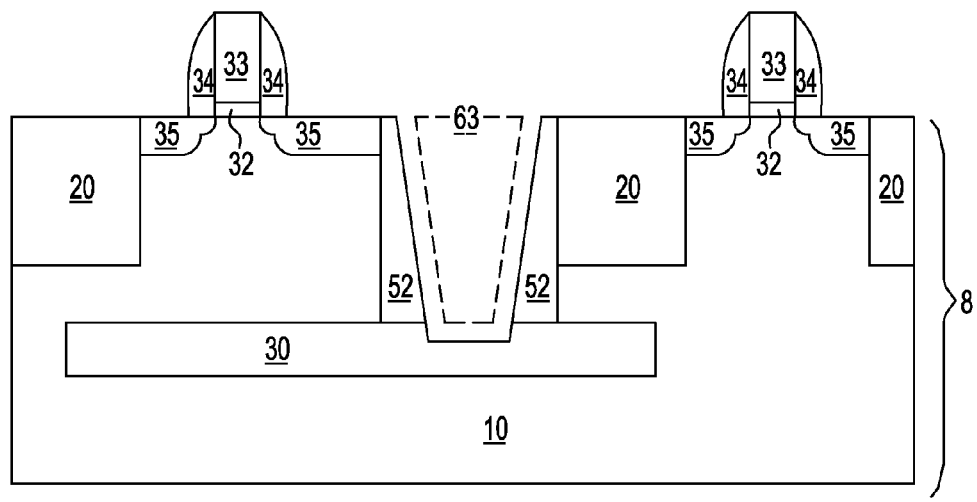
FIGS. 8-11 are sequential vertical cross-sectional views of the exemplary semiconductor structure according to the first embodiment of the present invention.

According to the first embodiment of the present invention, the salicide masking dielectric layer 60 is removed from above the semiconductor surfaces on which formation of a silicide is desired as shown in FIG. 8. Unless an unsilicided portion, i.e., a portion to be left as an unsilicided semiconductor surface, is desired on a semiconductor surface, the salicide masking dielectric layer 60 is removed altogether. If some unsilicided semiconductor surfaces are desired, the portions of the salicide masking dielectric layer 60 located directly above the semiconductor surfaces to be kept unsilicided are preserved on the semiconductor structure, while the remaining portions of the salicide masking dielectric layer 60 are removed. This is typically achieved by applying another photoresist (not shown) on the salicide masking dielectric layer 60 and patterning the photoresist to remove the portions of the salicide masking dielectric layer 60 only above the semiconductor surface on which a silicide formation is desired. Silicide is not formed on insulator surfaces such as on shallow trench isolation 20 or on gate spacers 34 irrespective of the presence or absence of the salicide masking dielectric layer 60 thereupon. In the exemplary structure according to the present invention shown in FIG. 8, the salicide masking dielectric layer 60 is removed from above the two MOSFETs so that a salicide may be formed on the source and drain regions 35 and on the gate conductor 33.

Figure 9:
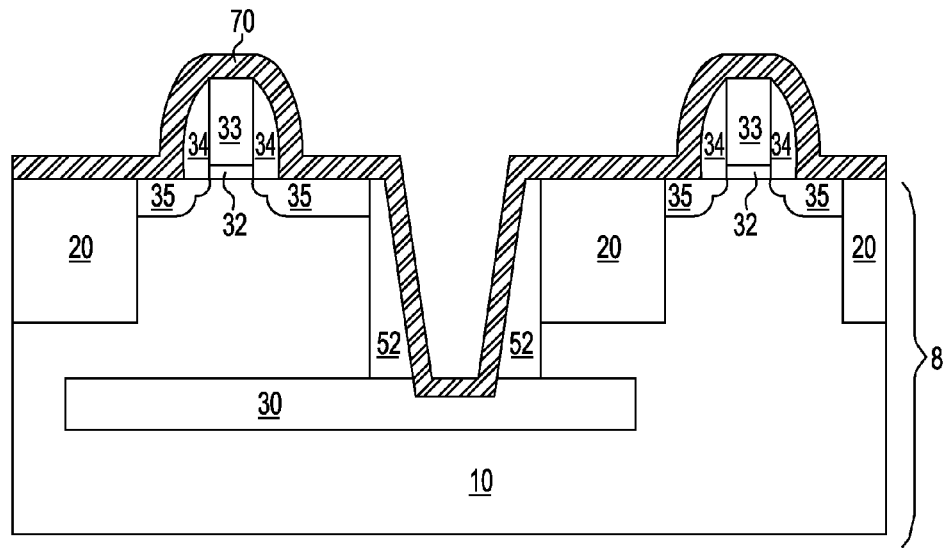

Referring to FIG. 9, a metal layer 70 is deposited on the semiconductor substrate 8 by methods well known in the prior art such as sputtering. The metal layer 70 comprises a metal that may form a silicide, such as Ta, Ti, W, Co, Ni, Pt, other refractory metals, and an alloy thereof. The deposition of the metal layer 70 may have less than 100% step coverage on the sidewalls of the trench 63 or on other vertical surfaces. The thickness of the metal layer 70 is generally be thick enough to provide more metal than is consumed during a subsequent silicidation process on all exposed semiconductor surfaces including the sidewalls of the contact trench 63. Alternatively, some portions of the metal layer 70, such as the sidewalls of the contact trench 63, may have less material than could be consumed during the silicidation process if the supply of metal was unlimited.

Figure 10:
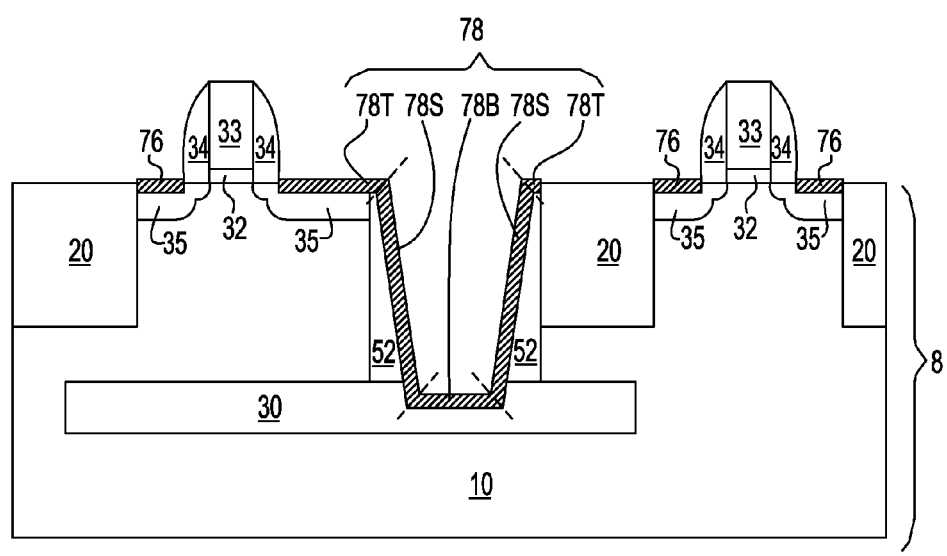

Referring to FIG. 10, at least one silicidation anneal is performed to react the metal layer 70 with the semiconductor material directly therebeneath, including the material in the buried conductive layer 30 and the sidewalls of the contact trench 63, to form a trench contact silicide 78 and optionally at least one metal silicide region 76. The unreacted material in the metal layer 70 is thereafter removed, for example, by a wet etch. The trench contact silicide 78 comprises a bottom trench contact silicide 78B contacting the buried conductive layer 30, a sidewall trench contact silicide 78S formed on the sidewalls of the contact trench 63 and adjoins the bottom trench contact silicide 78B, a top trench contact silicide 78T located on a top surface of the semiconductor substrate 8 and adjoins the sidewall trench contact silicide 78S. Silicide material located on the top surface of the semiconductor substrate 8 and adjoins, i.e., is contiguous with, the sidewall trench contact silicide 78S comprises the top trench contact silicide 78T. The top trench contact silicide 78T may function as a component of another semiconductor device. The at least one metal silicide region 76 is disjoined from, i.e., is not contiguous with, the trench contact silicide 78T. However, the at least one metal silicide region 76 has substantially the same composition and the same thickness as the top trench contact silicide 78T. The sidewall trench contact silicide 78S may be formed on the doped semiconductor region 52 as shown in FIG. 10 or, if a doped semiconductor region 52 is not formed, on the portion of the semiconductor layer 8 that comprises the sidewalls of the contact trench 63.

The bottom trench contact silicide 78B, the sidewall trench contact silicide 78S, and the top trench contact silicide 78T may have substantially the same thickness by depositing sufficient thickness of the metal layer 70 in the contact trench 63 on which trench contact silicide 78 is formed so that the silicide formation is not limited by the supply of the metal. Alternatively, the thickness of the bottom trench contact silicide 78B and the thickness of the sidewall trench contact silicide 78S may be less than the thickness of the top trench contact silicide 78T by limiting the amount of metal in the contact trench 63.

According to the first embodiment of the present invention, all silicides, that is, the bottom trench contact silicide 78B, the sidewall trench contact silicide 78S, the top trench contact silicide 78T, and the at least one metal silicide region 76 have substantially the same composition (except for minor variations caused by changes in the dopant type and concentration in the underlying semiconductor material).

Figure 11:
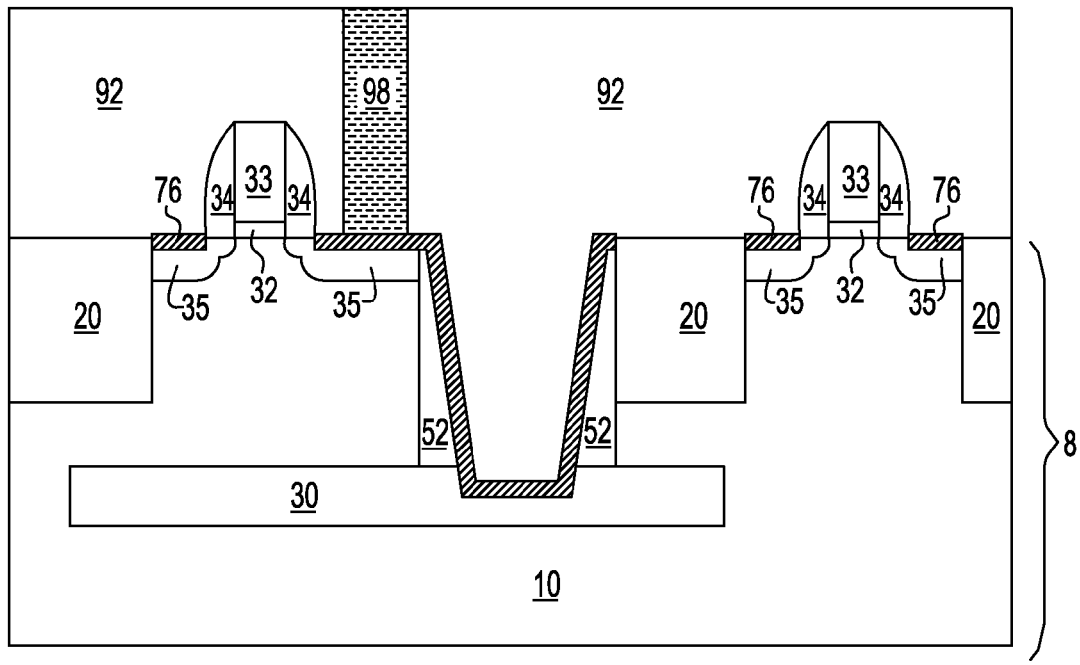

Referring to FIG. 11, a middle-of-line (MOL) dielectric 92 is deposited over the surface of the semiconductor substrate 8 and the semiconductor structures thereupon and planarized. The MOL dielectric 92 fills the contact trench 63. A contact via hole is formed in the MOL dielectric 92 and is filled with metal to form a contact via 98, which contacts the top trench contact silicide 78T.

Figure 12:
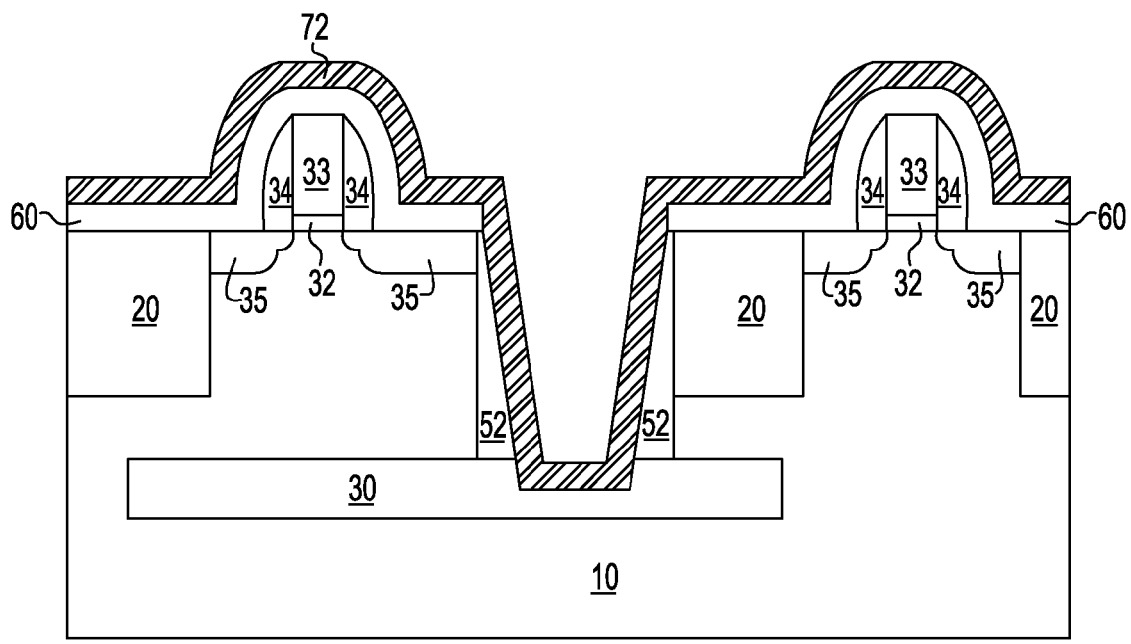
FIGS. 12-17 are sequential vertical cross-sectional views of the exemplary semiconductor structure according to the second embodiment of the present invention.

According to a second embodiment of the present invention, the salicide masking dielectric layer 60 is not removed after the removal of the photoresist 61 described in FIG. 7 and the accompanying paragraph above. Instead, a first metal layer 72 is deposited on the semiconductor substrate 8 by methods well known in the art such as sputtering as shown in FIG. 12. The first metal layer 72 comprises a metal that may form a silicide, such as Ta, Ti, W, Co, Ni, Pt, other refractory metals, and an alloy thereof. The deposition of the first metal layer 72 may have less than 100% step coverage on the sidewalls of the contact trench 63 or on other vertical surfaces. The thickness of the first metal layer 72 is typically thick enough to provide more metal than is consumed during a subsequent silicidation process on all exposed semiconductor surfaces including the sidewalls of the contact trench 63. Alternatively, if the step coverage on the sidewalls of the contact trench 63 is less than 100%, some portions of the first metal layer 72, such as the sidewalls of the contact trench 63, may have less material than could be consumed during a first silicidation process if the supply of the first metal was unlimited.

Figure 13:
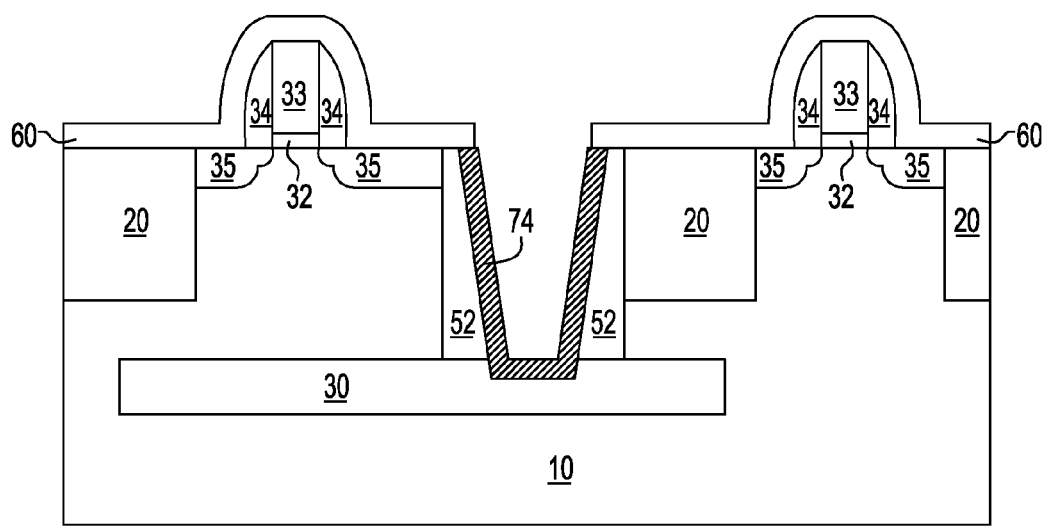

Referring to FIG. 13, at least one first silicidation anneal is performed during the first silicidation process to react the first metal layer 72 with the semiconductor material directly beneath the contact trench 63. The material in the buried conductive layer 30 reacts with the first metal layer 72 to form a bottom portion of a first stage trench contact silicide 74. The semiconductor material on the sidewalls of the contact trench 63 reacts with the first metal layer 72 to form a sidewall portion of a first stage trench contact silicide 74. The unreacted material in the first metal layer 72 is thereafter removed, for example, by a wet etch. The thickness of the first stage trench contact silicide 74, or the first stage thickness, is preferably substantially the same across the various portions of the first stage trench contact silicide 74 by depositing sufficient thickness of the first metal layer 72 in the contact trench 63 prior to the at least one silicidation anneal so that the silicide formation is not limited by the supply of the metal.

Figure 14:
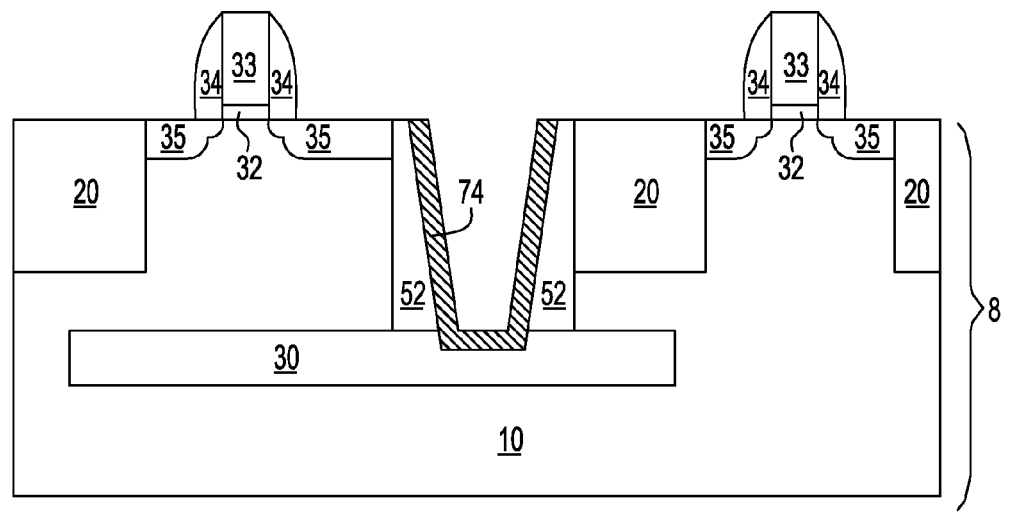

Referring to FIG. 14, the salicide masking dielectric layer 60 is removed from above the semiconductor surfaces on which formation of a silicide is desired. Unless an unsilicided portion, i.e., a portion to be left as an unsilicided semiconductor surface, is desired on the semiconductor surface, the salicide masking dielectric layer 60 is removed altogether. If some unsilicided semiconductor surfaces are desired, the portions of the salicide masking dielectric layer 60 located directly above the semiconductor surfaces to be kept unsilicided are preserved on the semiconductor structure, while the remaining portions of the salicide masking dielectric layer 60 are removed. The same methods described in the above paragraph accompanying FIG. 8 may be utilized to pattern the salicide masking dielectric layer 60.

Figure 15:
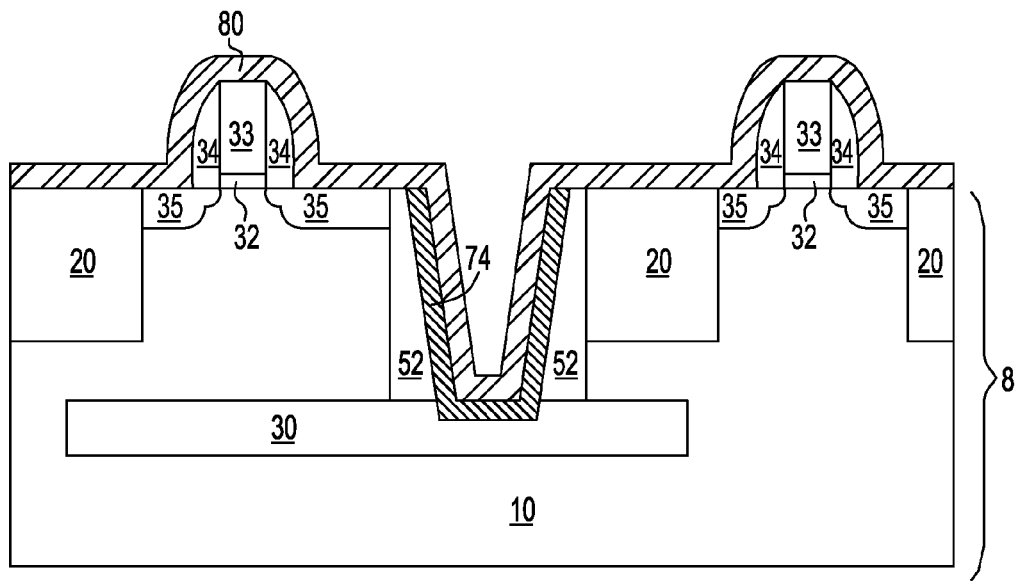

Referring to FIG. 15, a second metal layer 80 is deposited on the semiconductor substrate 8 and on the first stage trench contact silicide 74 by methods well known in the prior art such as sputtering. The second metal layer 80 comprises a metal that may form a silicide, such as Ta, Ti, W, Co, Ni, Pt, other refractory metals, and an alloy thereof. The second metal layer 80 may comprise the same material as the first metal layer 72, or alternatively, may comprise a different material. Also, the thickness of the second metal layer 80 may be the same or different from the thickness of the first metal layer 72. The deposition of the second metal layer 80 may have less than 100% step coverage on the sidewall portions of the first stage trench contact silicide 74 or on other vertical surfaces. The thickness of the second metal layer 80 is generally thick enough to provide more metal than is consumed during a subsequent silicidation process on all exposed semiconductor surfaces including the sidewalls of the contact trench 63. Alternatively, if the step coverage on the sidewalls of the first stage trench contact silicide 74 is less than 100%, some portions of the second metal layer 80, such as the portions on the sidewall portions of the first stage trench contact silicide 74, may have less material than could be consumed during a second silicidation process if the supply of the second metal was unlimited.

Figure 16:
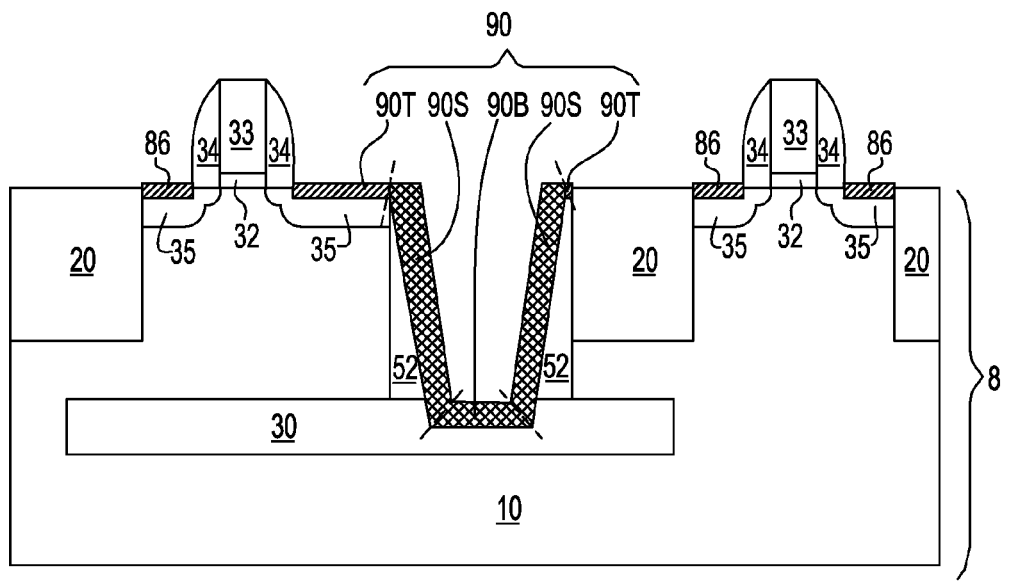

Referring to FIG. 16, at least one second silicidation anneal is performed during the second silicidation process to react the second metal layer 80 with the semiconductor material directly therebeneath, including the semiconductor material on a top surface of the semiconductor substrate 8, in the buried conductive layer 30 and the sidewalls of the contact trench 63, to form a trench contact silicide 90 and optionally at least one metal silicide region 86. The unreacted material in the second metal layer 80 is thereafter removed, for example, by a wet etch.

The trench contact silicide 90 according to the second embodiment of the present invention comprises a bottom trench contact silicide 90B contacting the buried conductive layer 30, a sidewall trench contact silicide 90S formed on the sidewalls of the contact trench 63 and adjoins the bottom trench contact silicide 90B, a top trench contact silicide 90T located on a top surface of the semiconductor substrate 8 and adjoins the sidewall trench contact silicide 90S. Silicide material located on the top surface of the semiconductor substrate 8 and adjoins, i.e., is contiguous with, the sidewall trench contact silicide 90S comprises the top trench contact silicide 90T. The top trench contact silicide 90T may function as a component of another semiconductor device. The at least one metal silicide region 86 is disjoined from, i.e., is not contiguous with, the trench contact silicide 90T. However, the at least one metal silicide region 86 has substantially the same composition and the same thickness as the top trench contact silicide 90T (except for variations caused by differences in the dopant type and concentration). The sidewall trench contact silicide 90S may be formed on the doped semiconductor region 52 as shown in FIG. 16 or, if a doped semiconductor region 52 is not formed, on the portion of the semiconductor layer 8 that comprises the sidewalls of the contact trench 63.

The bottom trench contact silicide 90B and the sidewall trench contact silicide 90S have substantially the same composition, or a "first composition" as it is described herein, for the silicide material. The first composition is determined by the composition of the first metal layer 72, the second metal layer 80, the process parameters of the first silicidation anneal, and the process parameters of the second silicidation anneal.

The bottom trench contact silicide 90B and the sidewall trench contact silicide 90S may have substantially the same thickness, or a first silicide thickness, by depositing a sufficient thickness of the first metal layer 72 and by depositing a sufficient thickness of the second metal layer 80 during the processing steps so that the first silicide thickness is determined only by the anneal process and not be the step coverage of either metal deposition process. Due to additional silicidation of semiconductor material on the sidewalls and on the bottom of the contact trench 63 during the second silicidation process, the first silicide thickness is normally greater than the first stage thickness of the first stage trench contact silicide 74 prior to the second silicidation process.

The top trench contact silicide 90T and the at least one metal silicide region 86 comprises silicides that are formed during the second silicidation process and have substantially the same composition, or a "second composition" as it is described herein. The second composition is determined only by the composition of the second metal layer 80 and the process parameters of the second silicidation anneal. The first composition and the second composition may or may not be the same. If the first metal layer 72 and the second metal layer 80 have different compositions, the first composition and the second composition are different.

The top trench contact silicide 90T and the at least one metal silicide region 86 have substantially the same thickness, or the second silicide thickness. In general, the second silicide thickness and the first silicide thickness are different. Typically, the first silicide thickness is greater than the second silicide thickness. If different materials are employed for the first metal layer 72 and the second metal layer 80 and under certain anneal conditions, it is possible for the second silicide thickness to be greater than the first silicide thickness. Both the first silicide thickness and the second silicide thickness may be in the range from about 5 nm to about 60 nm, and more preferably in the range from about 15 nm to about 40 nm.

Figure 17:
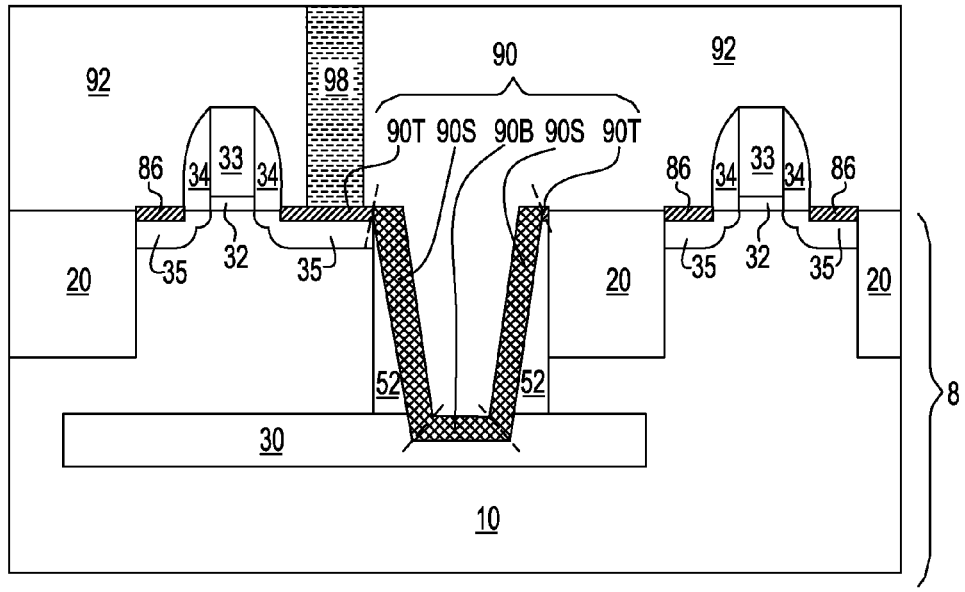

Referring to FIG. 17, a middle-of-line (MOL) dielectric 92 is deposited over the surface of the semiconductor substrate 8 and the semiconductor structures thereupon and planarized. The MOL dielectric 92 fills the contact trench 63. A contact via hole is formed in the MOL dielectric 92 and is filled with metal to form a contact via 98, which contacts the top trench contact silicide 78T. The structure in FIG. 17 has a doped semiconductor region 52 that adjoins the sidewall trench contact silicide 90S and the buried conductive layer 30. The doped semiconductor region 52 is topologically homeomorphic to a torus, i.e., the doped semiconductor region 52 may be transformed into a torus by continuous stretching and bending.

Figure 18:
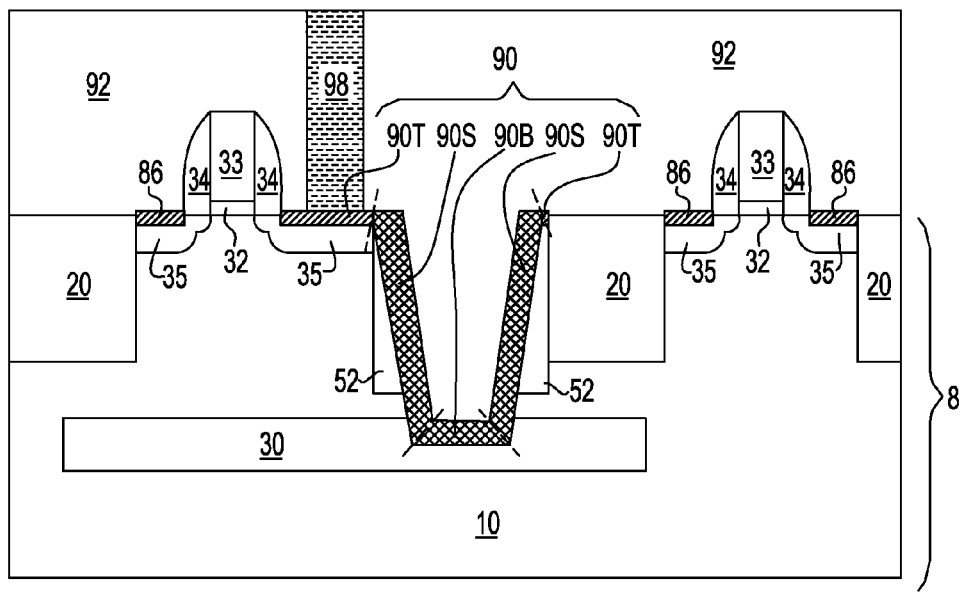
FIGS. 18-19 are vertical cross-sectional views of alternate exemplary semiconductor structures according to the second embodiment of the present invention

Referring to FIG. 18, a first alternate exemplary structure according to the second embodiment of the present invention is shown. In the structure in FIG. 18, the doped semiconductor region 52 adjoins the sidewall trench contact silicide 90S. Unlike the structure in FIG. 17, however, and the doped semiconductor region 52 does not adjoin the buried conductive layer 30. The depth of the buried conductive layer in this case may exceed 1.8 microns or the maximum projected range of implanted ions in conventional ion implantation into a silicon based semiconductor substrate, and thus may be in the range from about 2.0 microns to about 8.0 microns. The doped semiconductor region 52 is also topologically homeomorphic to a torus, i.e., the doped semiconductor region 52 may be transformed into a torus by continuous stretching and bending.

Figure 19:
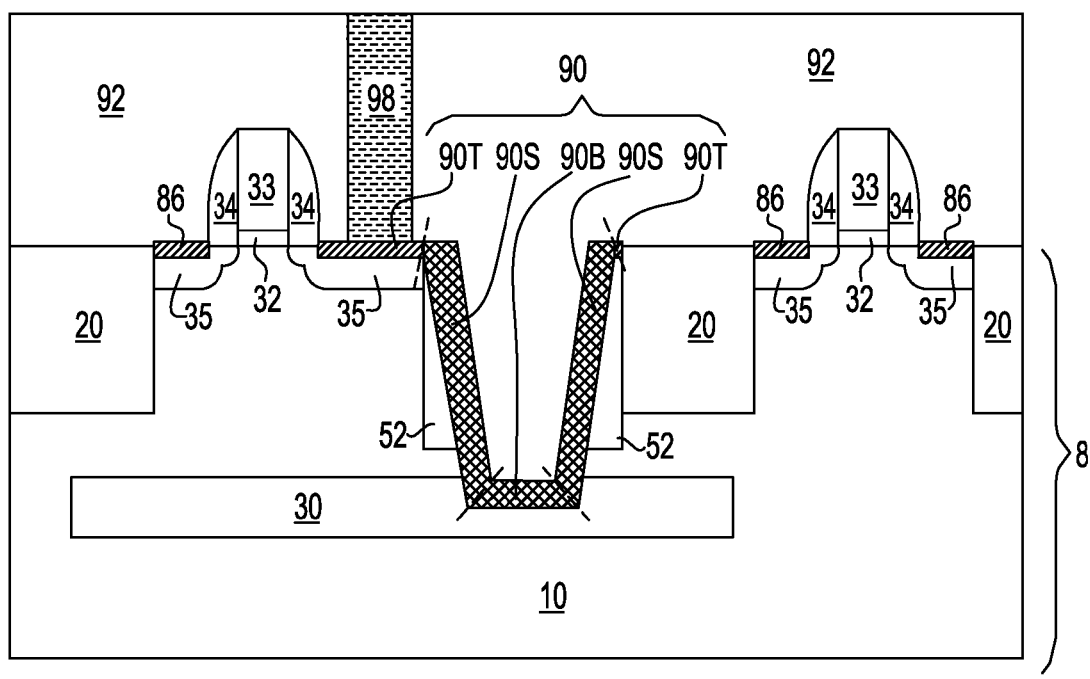

Referring to FIG. 19, a second alternate exemplary structure according to the second embodiment of the present invention is shown. In the structure in FIG. 19, the doped semiconductor region 52 is not present and the sidewall trench contact silicide is formed on the portion of the semiconductor layer 8 located on the sidewalls of the contact trench 63.

Structures corresponding to FIGS. 18 and 19 according to the first embodiment of the present invention and methods of manufacturing the same may be derived from FIGS. 11, 18, and 19 by a person of ordinary skill in the art and herein explicitly contemplated.

According to both embodiments of the present invention, due to the low resistivity of the silicide material in the trench contact silicide 78, the resistance of the current path from the contact via 98 through the trench contact 78 to the buried conductive layer is lower than the resistance of the current path from a contact via through a conventional reachthrough to a buried conductive layer with comparable dimensions according to the prior art. While the doped semiconductor region 52 further reduces the resistance of the conductive path by providing a parallel electrical path to the sidewall trench contact silicide (78S or 90S), the reduction of the total resistance is not substantial since the conductivity of a silicide is typically two orders of magnitude higher than the conductivity of the even the most heavily dopes semiconductor materials. Further, since the present invention allows the formation of contact trenches 63 exceeding the projected ranges of implanted ions in an ion implantation process, i.e., exceeding a depth of 2.0 microns, the buried conductive layer 30 may correspondingly have a depth exceeding the projected ranges of implanted ions in an ion implantation process according to the present invention.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a buried conductive layer in a semiconductor substrate;
   a trench contact silicide contacting said buried conductive layer and contacting a top surface of a semiconductor layer located above said buried conductive layer;
   a middle-of-line (MOL) dielectric located on and within said trench contact silicide; and
   a doped semiconductor region that is topologically homeomorphic to a torus, wherein an inner sidewall of said doped semiconductor region laterally contacts a sidewall of said trench contact silicide, and an outer sidewall of said doped semiconductor region is adjoined to, and underlies, said trench contact silicide.

2. The semiconductor structure of claim 1, further comprising a contact via contacting said trench contact silicide and surrounded by said MOL dielectric.

3. The semiconductor structure of claim 1, wherein said trench contact silicide has tapered sidewalls.

4. The semiconductor structure of claim 1, wherein said buried conductor layer is located at a depth in the range from about 2.0 microns to about 8.0 microns.

5. The semiconductor structure of claim 1, wherein said semiconductor substrate comprises a doped semiconductor region in contact with sidewalls of said trench contact silicide.

6. The semiconductor structure of claim 5, wherein said doped semiconductor region vertically extends from a top surface of said buried conductive layer to a topmost surface of said semiconductor substrate.

7. The semiconductor structure of claim 1, wherein said trench contact silicide includes:
   a bottom trench contact silicide contacting said buried conductive layer;
   a sidewall trench contact silicide adjoining said bottom trench contact silicide; and
   a top trench contact silicide located on a top surface of said semiconductor substrate and adjoining said sidewall trench contact silicide.

8. The semiconductor structure of claim 7, wherein said bottom trench contact silicide, said sidewall trench contact silicide, and said top trench contact silicide have a substantially same composition.

9. The semiconductor structure of claim 7, wherein said bottom trench contact silicide, said sidewall trench contact silicide, and said top trench contact silicide have a substantially same thickness throughout the entirety thereof.

10. The semiconductor structure of claim 7, wherein said top trench contact silicide is in contact with one of source and drain regions of a field effect transistor located on said semiconductor substrate.

11. The semiconductor structure of claim 7, wherein said bottom trench contact silicide and said sidewall trench contact silicide differ from said top trench contact silicide by at least one of composition and thickness.

12. The semiconductor structure of claim 1, further comprising a contact via structure contacting said trench contact silicide and surrounded by said MOL dielectric.

13. The semiconductor structure of claim 1, wherein said trench contact silicide has tapered sidewalls, and said buried conductor layer is located below a shallow trench isolation structure and is disjoined from said shallow trench isolation structure.

14. The semiconductor structure of claim 13, wherein said contact via structure is in contact with said top trench contact silicide.

15. The semiconductor structure of claim 1, wherein said trench contact silicide includes at least:
   a bottom trench contact silicide contacting said buried conductive layer; and
   a top trench contact silicide located on a top surface of said semiconductor substrate, wherein said bottom trench contact silicide and said top trench contact silicide differ by at least one of composition and thickness.

16. The semiconductor structure of claim 15, wherein said bottom trench contact silicide and said top trench contact silicide differ by composition and thickness.

17. A semiconductor structure comprising:
   a buried conductive layer in a semiconductor substrate;
   a trench contact silicide contacting said buried conductive layer and contacting a top surface of a semiconductor layer located above said buried conductive layer;
   a middle-of-line (MOL) dielectric located on and within said trench contact silicide, wherein said trench contact silicide includes:
   a bottom trench contact silicide contacting said buried conductive layer;
   a sidewall trench contact silicide adjoining said bottom trench contact silicide; and a top trench contact silicide located on a top surface of said semiconductor substrate and adjoining said sidewall trench contact silicide, and wherein said bottom trench contact silicide and said sidewall trench contact silicide have a first thickness, said top trench contact silicide has a second thickness, wherein said first thickness and said second thickness are different.

18. The semiconductor structure of claim 17, wherein said first thickness is greater than said second thickness.

19. A semiconductor structure comprising:
- a buried conductive layer in a semiconductor substrate;
- a trench contact silicide contacting said buried conductive layer and contacting a top surface of a semiconductor layer located above said buried conductive layer;

a middle-of-line (MOL) dielectric located on and within said trench contact silicide, wherein said trench contact silicide includes:
- a bottom trench contact silicide contacting said buried conductive layer;
- a sidewall trench contact silicide adjoining said bottom trench contact silicide; and
- a top trench contact silicide located on a top surface of said semiconductor substrate and adjoining said sidewall trench contact silicide, and wherein said bottom trench contact silicide and said sidewall trench contact silicide have a first composition, said top trench contact silicide has a second composition, and said first composition and said second composition are different.

20. The semiconductor structure of claim 19, wherein said first composition includes a silicide of a metallic element, and said second composition includes a silicide of an alloy of said metallic element and another metallic element.

* * * * *